(12) United States Patent
Penjovic et al.

(10) Patent No.: US 10,598,480 B2
(45) Date of Patent: Mar. 24, 2020

(54) WAFER PROBING

(71) Applicant: Infineon Technologies AG, Neubiberg (DE)

(72) Inventors: Ivan Penjovic, Munich (DE); Oliver Nagler, Munich (DE)

(73) Assignee: Infineon Technologies AG, Neubiberg (DE)

( * ) Notice: Subject to any disclaimer, the term of this patent is extended or adjusted under 35 U.S.C. 154(b) by 381 days.

(21) Appl. No.: 15/471,565

(22) Filed: Mar. 28, 2017

(65) Prior Publication Data

US 2017/0292832 A1 Oct. 12, 2017

(30) Foreign Application Priority Data

Apr. 8, 2016 (DE) .................. 10 2016 106 508

(51) Int. Cl.
*G01R 1/067* (2006.01)
*G01B 11/08* (2006.01)

(52) U.S. Cl.
CPC ............ *G01B 11/08* (2013.01); *G01R 1/0675* (2013.01); *G01R 1/06738* (2013.01)

(58) Field of Classification Search
CPC ................ G01R 1/06705; G01R 29/12; G01R 31/2808; G01R 31/2887

See application file for complete search history.

(56) References Cited

U.S. PATENT DOCUMENTS

| | | | | |
|---|---|---|---|---|
| 6,127,831 A | * | 10/2000 | Khoury | G01R 3/00 324/750.02 |
| 2001/0054905 A1 | * | 12/2001 | Khandros | H05K 3/4015 324/755.05 |
| 2002/0053734 A1 | * | 5/2002 | Eldridge | B23K 20/004 257/724 |
| 2014/0090480 A1 | | 4/2014 | Adams et al. | |

\* cited by examiner

*Primary Examiner* — Tung X Nguyen
(74) *Attorney, Agent, or Firm* — Dicke, Billig & Czaja, PLLC

(57) ABSTRACT

A method of determining a minimum permissible tip diameter of probing needles of a probe card for wafer probing is described. The method includes performing a plurality of contact procedures of at least one probing needle to a plurality of bonding pads on a wafer. The plurality of contact procedures is performed at different stress applied by the at least one probing needle to the bonding pads. A chart of indentation depths of the plurality of bonding pads caused by the contact procedures at different stress is determined. A set of calibration coefficients based on the chart is determined, wherein the set of calibration coefficients allows to compute a predicted indentation depth as a function of stress. The minimum permissible probing needle tip diameter is determined based on an evaluation of the function.

13 Claims, 11 Drawing Sheets

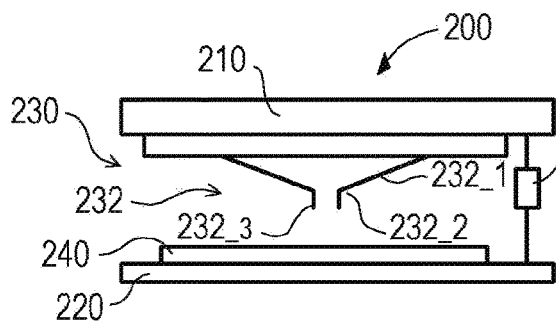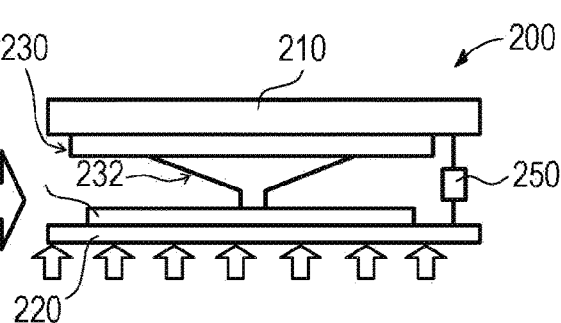
Fig. 2A  Fig. 2B
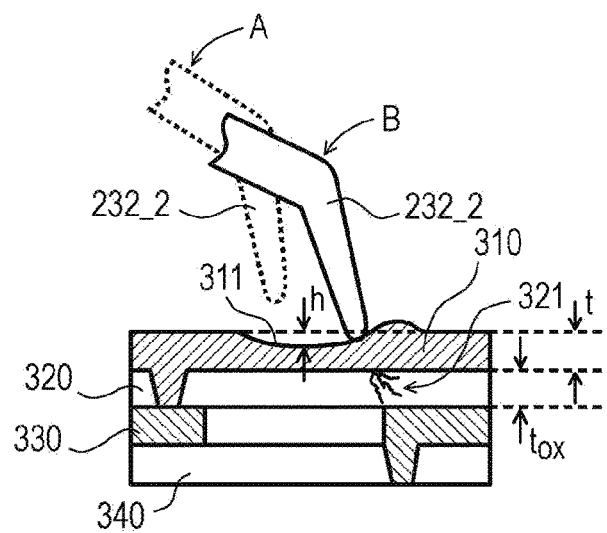
Fig. 3
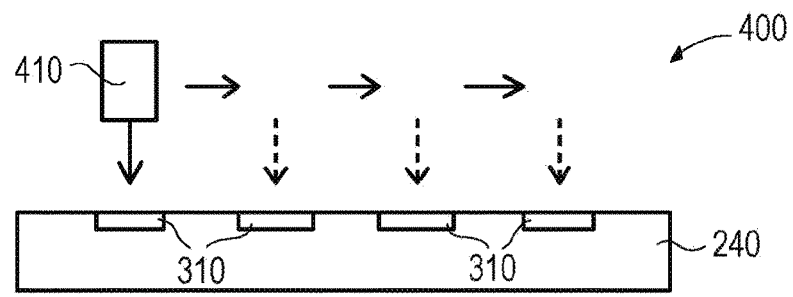
Fig. 4

WAFER PROBING

CROSS-REFERENCE TO RELATED APPLICATION

This Utility Patent Application claims priority to German Patent Application No. 10 2016 106 508.0, filed Apr. 8, 2016 which is incorporated herein by reference.

BACKGROUND

This disclosure relates in general to the technique of wafer probing. The integrity of bonding pads on a wafer strongly affects the performance of the microelectronic device to be produced. In wafer testing, probing needles are used to contact bonding pads on a wafer. During probing, contact forces have to achieve sufficient values to ensure a low resistance and stable electrical contact to the bonding pad without causing mechanical damage to the bonding pad and/or the underlying layers. High contact forces may cause a plastic deformation or indentation depth ("scrub depth") on the bonding pad which could reduce reliability of wire bonding during subsequent manufacturing stages. Further, high contact forces could cause cracks in the oxide layer beneath the bonding pad.

SUMMARY

Various embodiments pertain to a method of determining a minimum permissible tip diameter of probing needles of a probe card for wafer probing. The method includes performing a plurality of contact procedures of at least one probing needle to a plurality of bonding pads on a wafer. The plurality of contact procedures is performed at different stress applied by the at least one probing needle to the bonding pads. A chart of indentation depths of the plurality of bonding pads caused by the contact procedures at different stress is determined. A set of calibration coefficients based on the chart is determined, wherein the set of calibration coefficients allows to compute a predicted indentation depth as a function of stress. The minimum permissible probing needle tip diameter is determined based on an evaluation of the function.

Various embodiments pertain to a method of adjusting tip diameters of probing needles of a probe card for wafer probing. The method includes determining a minimum permissible probing needle tip diameter of the probing needles according to one of the preceding claims. The tip diameters of the plurality of probing needles of the probe card are measured. The probing needle tip diameters are adjusted so as to be equal to or greater than the minimum permissible probing needle tip diameter.

Various embodiments pertain to a method of determining a crack probability distribution of an underlying layer arranged beneath a plurality of bonding pads on a wafer. The method includes performing a plurality of contact procedures of at least one probing needle to a plurality of bonding pads on the wafer, wherein the plurality of contact procedures is performed at least at two different stresses applied to the bonding pads by the at least one probing needle. At least two different stresses applied to the underlying layer based on the at least two different stresses applied to the bonding pads are determined. For each of the at least two different stresses applied to the underlying layer a measured crack probability of the underlying layer is determined. Then, a set of parameters of a given probability distribution based on the measured crack probabilities is determined, wherein the set of parameters allows to compute the crack probability distribution.

Various embodiments pertain to a wafer test equipment. The wafer test equipment includes a wafer support configured to place a wafer thereon. The test equipment further includes a probe card holder configured to hold a probe card and a manipulator configured to touch-down the probe card on the wafer. The probe card comprises a plurality of probing needles for contacting bonding pads on the wafer. The test equipment further includes a computation unit configured to determine a set of calibration coefficients, wherein the set of calibration coefficients allows to compute a predicted indentation depth of a probing needle on a bonding pad as a function of stress applied by the probing needle to the bonding pad. The computation unit is further configured to determine the minimum permissible probing needle tip diameter based on an evaluation of the function.

Various embodiments pertain to a computer program for determining a minimum permissible probing needle tip diameter of probing needles of a probe card for wafer probing. The computer program, when running on a computer or loaded in a computer carries out or is capable of carrying out a method including recording a chart of indentation depths on bonding pads caused by a plurality of contact procedures of at least one probing needle to a plurality of bonding pads on the wafer. The contact procedures are performed at different stress applied by the at least one probing needle to the bonding pads. Based on the chart, a set of calibration coefficients is determined. Based on the set of calibration coefficients, a predicted indentation depth as a function of the stress is computed. The minimum permissible probing needle tip diameter is determined based on an evaluation of the function.

Various embodiments pertain to a computer program for determining a crack probability distribution of an underlying layer arranged beneath a plurality of bonding pads on a wafer when subjected to a plurality of contact procedures of at least one probing needle to the plurality of bonding pads, wherein the plurality of contact procedures is performed at least at two different stresses applied to the bonding pads by the at least one probing needle. The computer program, when running on a computer or loaded in a computer carries out or is capable of carrying out a method including determining at least two different stresses applied to the underlying layer based on at least two different stresses applied to the bonding pads. The method further includes determining a set of parameters of a given probability distribution based on measured crack probabilities for the at least two different stresses applied to the underlying layer, and computing the crack probability distribution based on the determined set of parameters.

Various embodiments pertain to the above-mentioned computer program, wherein the method further comprises determining a minimum permissible probing needle tip diameter based on an evaluation of the crack probability distribution at a maximum permissible crack probability.

Various embodiments pertain to an apparatus for determining a minimum permissible tip diameter of probing needles of a probe card for wafer probing. The apparatus comprises means for performing a plurality of contact procedures of at least one probing needle to a plurality of bonding pads on a wafer, wherein the plurality of contact procedures is performed at different stress applied by the at least one probing needle to the bonding pads; means for determining a chart of indentation depths of the plurality of bonding pads caused by the contact procedures at different stress; means for determining a set of calibration coefficients based on the chart, wherein the set of calibration coefficients allows to compute a predicted indentation depth as a function of the stress; and means for determining the minimum permissible probing needle tip diameter based on an evaluation of the function.

Various embodiments pertain to an apparatus for determining a crack probability distribution of an underlying layer arranged beneath a plurality of bonding pads on a wafer. The apparatus further includes means for performing a plurality of contact procedures of at least one probing needle to a plurality of bonding pads on the wafer, wherein the plurality of contact procedures is performed at least at two different stresses applied to the bonding pads by the at least one probing needle, means for determining at least two different stresses applied to the underlying layer based on the at least two different stresses applied to the bonding pads, means for determining for each of the at least two different stresses applied to the underlying layer a measured crack probability of the underlying layer, and means for determining a set of parameters of a given probability distribution based on the measured crack probabilities, wherein the set of parameters allows to compute the crack probability distribution.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 2A-2B are a cross-sectional views illustrating an example wafer test equipment for wafer probing before and after touch down of a probe card on a wafer.

FIG. 3 is a cross-sectional view illustrating an example indentation on a bonding pad on a wafer caused by a probing needle contacting the bonding pad.

FIG. 4 is a cross-sectional view illustrating an example process of measuring the indentation depths of a plurality bonding pads on a wafer.

DETAILED DESCRIPTION

Figure 1:
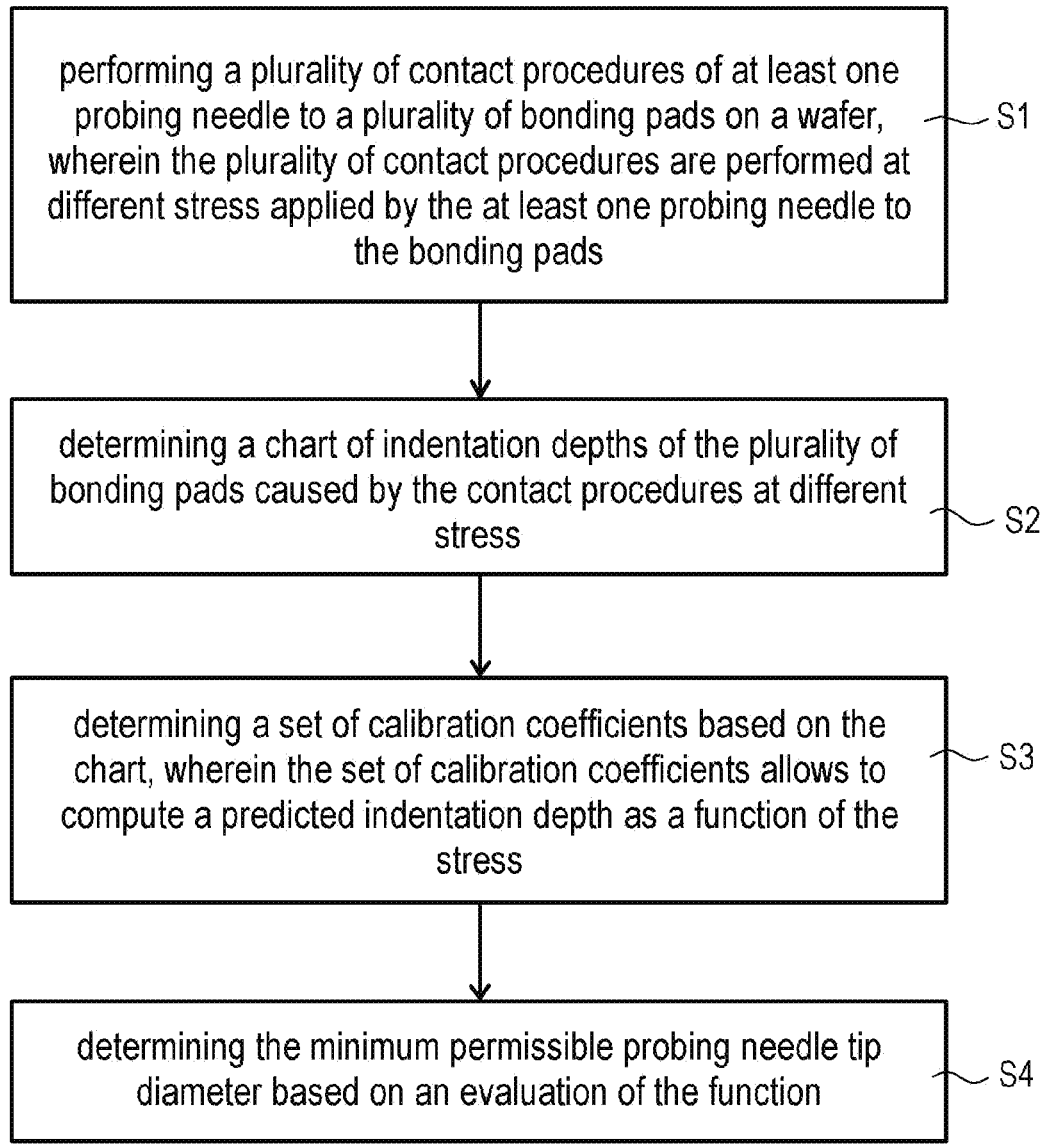
FIG. 1 is a flow-chart of an example method of determining a minimum permissible tip diameter of probing needles of a probe card for wafer probing.

In the following detailed description, reference is made to the accompanying drawings, which form a part thereof, and in which is shown by way of illustration specific embodiments in which the invention may be practiced. In this regard, directional terminology, such as "top", "bottom", "front", 'back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other unless specifically noted otherwise.

Further, as employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "directly on", e.g. in direct contact with, the implied surface. The word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. The same applies analogously to the terms "under", "below", "beneath", etc.

The wafer described herein may be of various materials, among them crystalline, polycrystalline or amorphous materials. By way of example, the wafer may be of a semiconductor material, such as, e.g., Si, SiC, SiGe, GaAs, GaN, AlGaN, InGaAs, InAlAs, etc, and, furthermore, may contain inorganic and/or organic materials that are not semiconductors.

The term "wafer" as used in this disclosure may have a broad meaning. By way of example, a wafer may be fabricated by an eWLP (embedded Wafer Level Packaging) process. In this case, semiconductor components (e.g. chips, dies etc.) are placed in a spaced-apart relationship on a carrier and an insulating encapsulation material is then applied (e.g. laminated or molded) over the carrier and over the semiconductor components placed thereon to form a so-called artificial wafer. Such artificial wafer is also intended to be included by the meaning of the term "wafer" as used in this disclosure. The artificial wafer may include a high number of semiconductor components. Similar as the bulk semiconductor wafer may eventually be divided into single chips, the artificial wafer may eventually be divided into single semiconductor device packages each containing one or more semiconductor components which are packaged by an encapsulant formed of the insulating encapsulation material. The encapsulation material may include or consist of a polymer material, e.g. a thermoplastic material, a thermoset material, a filled or unfilled mold or laminate material, or a fiber-reinforced mold or laminate material.

The wafer has bonding pads (electrodes) disposed on at least one of its main surfaces. The bonding pads allow electrical contact to be made with the integrated circuits included in the wafer (including, e.g., the integrated circuits of the semiconductor components embedded in an artificial wafer). The bonding pads may include one or more metal layers which are applied to the semiconductor material of the wafer. The metal layers may be manufactured with any desired geometric shape and any desired material composition. The metal layers may, for example, be in the form of a layer or land covering an area. By way of example, any desired metal capable of forming a solder bond or diffusion solder bond, for example Cu, Al, Au, Ni, AlCu, NiSn, Ag, Pt, Pd, In, Sn, and an alloy of one or more of these metals may be used as the material. The metal layers need not be homogenous or manufactured from just one material, that is to say various compositions and concentrations of the materials contained in the metal layers are possible.

Furthermore, the integrated circuits described herein may be of different type, and may include, for example, monolithic integrated electrical, electro-optical or electro-mechanical circuits or passives. The integrated circuits may, for example, be designed, e.g., as logic integrated circuits, analog integrated circuits, mixed signal integrated circuits, power integrated circuits, memory circuits, level shifters, drivers, microcontrollers, batteries or integrated passives such as, e.g., so-called PID (passive integrated device).

Wafer probing is used for testing integrated circuit devices. Wafer probing is used to test the performance of the integrated devices in order to determine which of the integrated devices in a wafer are the good ones and which are the bad ones. For the reason that subsequent packaging and the assembly process are expensive, it is desirable to package only the good integrated devices to save manufacturing costs. This can be achieved by distinguishing between good and bad integrated devices (e.g. integrated circuits) on wafer level, i.e. by the technique of wafer probing.

During wafer probing, probing needles of a probe card are contacting bonding pads on the wafer. The probe card provides an interface between the wafer test equipment and the integrated circuits under test. During probing, contact forces between the probing needles and the bonding pads have to achieve sufficient values to ensure a low and stable electrical contact between the wafer test equipment and the integrated circuits. On the other hand, if the contact forces are too high, probing may cause undue damage to the bonding pad and/or to the layer(s) underlying the bonding pad.

More specifically, subsequent wire bonding may require sufficient residual bonding pad thickness for reliable adhesion between the wire bond ball and the bonding pad. Therefore, the indentation depth (also referred to as "scrub depth") caused by a contact of the probing needle on the bonding pad should not exceed a critical limit. Exceeding such critical limit is considered as a first type of probing damage. Another type of probing damage is the occurrence of a crack in the underlying layer(s) of the bonding pad. The occurrence of a crack may lead to a failure of the integrated device.

The indentation depth created by a probing needle-bonding pad contact procedure depends, inter alia, on the force applied on the bonding pad and on the geometry of the tip of the probing needle, and, in particular, on the tip diameter thereof. A probe card may carry more than 10000, 15000 or even 20000 probing needles with variations in tip diameter which may be as great as >±20 or 25%. Therefore, a consistent indentation depth on the bonding pads and/or a consistent crack probability of the underlying layer underlying the bonding pads cannot be realized. Hence, finding optimum probing parameters and an appropriate bonding pad layer stack design for parts-per-million reliability is a challenge.

Every wafer technology varies in several specifications such as, e.g., layer thickness, material and design. In particular, layer thickness, material and design of the bonding pads may be different. This requires a unique wafer probing solution for each wafer technology. For a new probing card-to-bonding pad combination, a full qualification regarding wafer probing reliability (considering critical indentation depths and crack probability) has to be performed. Such qualification includes extensive experimental work. Typically, hundreds of thousands (up to millions) bonding pads are prepared via chemical etching procedures and have to be checked for damages (bonding pad damages or underlying layer cracks) manually via optical microscopy.

In general, experiments and response measurements for wafer probing are repeated several times and often up to several months, until a mean value of a probing needle tip diameter is determined which is expected to be safe. This work has to be done in the past by highly experienced experts but nevertheless, a substantial risk of failure could not be excluded.

As the probing needle tip diameters on a probe card are not consistent, they are conventionally regarded as one tip with a diameter of a mean value and a standard deviation according to a Gaussian distribution determined by tip diameter measurements. However, the probing needle tip diameters are in reality not Gaussian distributed and further, the tip diameter of each single probing needle can change (even during productive test) without causing a significant change in mean value and standard deviation. This can be a high risk factor in reliability, leading to a necessity for regularly monitoring and re-qualification of the probe card during production using confocal microscopy. This necessity of regular indentation depth monitoring and/or crack monitoring for reasons of maintenance further requires expensive measurement systems, is very time consuming and can therefore only be realized with measurements on random basis—again assuming indentation depths to be normal distributed.

If during these initial and/or regular qualification or maintenance procedures a mean probing needle tip diameter value of a probe card has been determined which is expected to be safe (i.e. probing damages in terms of critical indentation depths and/or cracks are believed to be below a certain acceptable rate), the probing needle tips of the probe card used in production may be shaped to a diameter value witch has a sufficient distance from the determined mean value.

FIG. 1 is a flow-chart illustrating an example embodiment of a method of determining a minimum permissible tip diameter of probing needles of a probe card. At S1 at least one touch-down of a probe card on a wafer is performed. The probe card comprises a plurality of probing needles contacting bonding pads on the wafer.

The touch-down of the probe card on the wafer may be performed at known overdrive. The overdrive is the distance over which the probe card holder and the wafer support (chuck) still approach relative to each other from the initial probing needle-bonding pad contact position to the setting position of the probe card holder and the wafer support. Neglecting the indentation depth, this is the distance the tip of a probing needle is vertically displaced relative to the probe card by the touch-down movement of the probe card. The overdrive can be taken as a quantity which is identical for all probing needles for one touch-down—see the above definition. However, it is also possible that individual (or individually corrected) overdrives for each probing needles are recorded as a result of small differences of the initial tip positions of the probing needles before contacting the individual bonding pads.

The (common or individual) overdrives allow to compute a contact force exerted by the probing needles on the bonding pads. Again, this contact force may be a common contact force identical for all probing needles or an individual contact force for each probing needle.

Further, the individual tip diameters of the plurality of probing needles of the probe card may be known. The tip diameters may have been measured e.g. before the touch-down in a probe card analyzer using, e.g., optical inspection. It is to be noted that such probing needle tip diameter analysis may be configured to measure and record each individual tip diameter (of, e.g., equal to or more than 10000, 15000 or even 20000) of the probing needles of a probe card.

This or other processes allow to derive the individual stress applied by each probing needle to the corresponding bonding pad on the wafer. By way of example, the individual stress can be derived by the equation $\sigma=F/A$, wherein F is the (individual or common) contact force exerted by a probing needle on a bonding pad and A is the probing needle tip surface area. The force F may be derived as a function of the overdrive d, e.g. on the basis of Hooke's law according to $F=Kd$, where K is the stiffness of the spring action of the probing needle. A may be expressed by $A=\pi D^2/4$, wherein D is the (individual) probing needle tip diameter.

At S2 a chart of individual indentation depths of the (individual) bonding pads caused by the contact procedures at different stress is determined. The indentation depth measurement, also referred to as imprint measurement, may be performed by confocal microscopy. The chart may include for each probing needle a specific indentation depth caused on a bonding pad by the specific tip diameter of the probing needle.

At S3 a set of calibration coefficients is determined based on the chart. The set of calibration coefficients allow to compute a predicted indentation depth as a function of stress applied by a probing needle to a bonding pad. Therefore, as the individual stress applied by each probing needle is known, an individual predicted indentation depth for each probing needle-bonding pad combination may be computed.

It is to be noted that the approach of determining a set of calibration coefficients at S3 to compute predicted indentation depths allows a separation of all influences on pad damage (e.g. probe force, tip diameter, bonding pad material, bonding pad thickness). This makes a full DoE (Design of Experiments) for qualification of new wafer technologies unnecessary.

Further, the effort caused by a regular monitoring of bonding pad damage during manufacturing can be decreased or completely avoided by the "indirect" monitoring the bonding pad damage (e.g. indentation depth, also layer crack as will be explained later) as a function of stress applied by each individual probing needle to a bonding pad according to S3. Thus, the method of predicting and/or indirectly monitoring individual indentation depths of the bonding pads significantly facilitates the design of a new wafer technology and its application during chip production.

It is to be noted that at S3 the individual impact every probing needle of a probe card applies on a bonding pad on a wafer may be taken into account. This highly decreases the experimental effort for obtaining the set of calibration coefficients, because a single touch-down with a probe card of, e.g., 10000 probing needles provides 10000 experimental results rather than is regarded as a single probing needle tip with a mean value and a high uncertainty of the actual tip diameter distribution. Quite to the contrary, as one touch-down can be regarded as an execution of 10000 experiments with high accuracy of input parameters, the set of calibration coefficients may be determined on the basis of one or a small number of touch-down procedures. That way, having determined the set of calibration coefficients, bonding pad damage can be easily predicted or "indirectly" monitored on the basis of the (individual) stress applied by each probing needle of the probe card to a corresponding bonding pad.

At S4 a minimum permissible probing needle tip diameter may be determined based on an evaluation of the function. The minimum permissible probing tip diameter may, e.g., be determined on the basis of a maximum permissible indentation depth. According to the function, the maximum indentation depth corresponds to a maximum permissible stress. The minimum permissible probe tip diameter may then be determined based on this maximum permissible stress and on a further input quantity. This further input quantity may, e.g., be a touch-down force or a touch-down overdrive to be applied to the probe card during wafer probing.

Once the minimum permissible probing needle tip diameter has been determined at S4, the probe card may be machined to comply with this minimum permissible probing needle tip diameter. By way of example, if one or more of the tip diameters of the probing needles is/are smaller than the minimum permissible probing needle tip diameter, the diameter of the probing needle tips may be enhanced to exceed the minimum permissible probing needle tip diameter as determined at S4. Otherwise, if all probing needle tip diameters are greater than the determined minimum permissible probing needle tip diameter, the tip diameters of the probing needles may be machined (i.e. reduced) to come closer to the minimum permissible probing needle tip diameter as determined at S4. That way, wafer probing may continuously be performed at near optimum probing needle-bonding pad contact behavior, so that a damage-free and highly reliable wafer probing process can be achieved and maintained during production without the need of conducting any or at least extensive process monitoring through imprint measurements on bonding pads.

FIG. 2A illustrates a cross-sectional view illustrating an exemplary wafer test equipment for wafer probing. In FIG. 2A the wafer test equipment 200 may include a holder 210, a wafer support (chuck) 220 and a manipulator 250 configured vary the distance between the holder 210 and the wafer support 220. A probe card 230 may be attached to the holder 210. The probe card 230 may include a probing needle carrier 231 and a plurality of probing needles 232 fixed at the probing needle carrier 231. The probing needle carrier 231 may, e.g., be a PCB (printed circuit board). The probing needles 232 may be of a cantilever type having a cantilever section 232_1 and a tip section 232_2. The tip section 232_2 is substantially oriented in a vertical direction and oriented inclined to the cantilever section 232_1. The tip section 232_2 of the probing needle 232 has a tip surface area A and/or tip surface diameter D.

For the sake of simplification, the tip diameter surface A may be assumed to be circular, so as to yield $A=\pi D^2/4$. However, it is also possible that the contact surface of the tip has another shape. In this case, any deviation from the circular shape may be taken into account when speaking of the tip contact area A and the tip diameter D. In other words, the meaning of the expression "tip diameter" in this description shall not be construed as to limit the contact area of the tip 232_3 of the probing needles 232 to a circular design. In contrast, any shape of the contact area should be comprised and the expression of the tip diameter D may be interpreted simply as a "nominal" tip diameter given by the above formula based on the actual tip contact area A.

Referring to FIG. 2A, a wafer 240 may be placed on the wafer support 220. The wafer 240 may be produced by a specific semiconductor technology. By way of example, a (specific) semiconductor technology may be defined, inter alia, by a specific bonding pad material, a specific thickness of the bonding pads, a specific design of the bonding pads and a specific stack of layers beneath the bonding pads. As a specific example, the stack of layers may comprise a single oxide layer of a specific thickness beneath all bonding pads. The term "wafer technology" as used herein is also referred to as a "processing line" in the art.

FIG. 2B illustrates the wafer test equipment during a touch-down of the probe card 230 on the wafer 240. During touch-down the tips 232_3 of the probing needles 232 get in contact with the bonding pads on the wafer 240. The touch-down may be accomplished by the manipulator 250. The manipulator 250 may be configured to approach the wafer support 220 and the holder 210 to each other, e.g. by lifting the wafer support 220 (see, e.g., FIG. 2B) and/or by lowering the holder 210.

The vertical position of the holder 210 (and hence of the probe card 230) and the vertical position of the wafer support 220 (and hence of the wafer 240) can be controlled with high precision. In particular, the overdrive (displacement d from initial probing needle-bonding pad contact to the setting position of the wafer test equipment 200) may be precisely measured.

FIG. 3 illustrates a cross-sectional view of an exemplary indentation 311 produced on a bonding pad of a wafer 240. In FIG. 3 only a small part of the wafer 240 at the position of a bonding pad 310 is shown. The bonding pad 310 may be made of a metal of thickness t. The bonding pad 310 may include or consist of any of the metals mentioned above.

An underlying layer 320 extends beneath the bonding pad 310. The underlying layer 320 may, e.g., be an insulation layer such as, e.g., an inorganic layer, e.g. including or consisting of $SiO_2$ or another insulating material. The underlying layer may also be represented by bulk semiconductor material layer doped to form a pn junction. The underlying layer 320 may have a thickness $t_{ox}$. The underlying layer 320 may, e.g., also be composed of a stack of underlying layers, e.g. a stack of insulation layers.

Before contacting the bonding pad 310, the probing needle 232 is in position A. In the setting position the probing needle 232 is in position B. As apparent from FIG. 3, the contact of the probing needle 232 has produced an indentation 311 of depth h in the surface of the bonding pad 310. The indentation 311 of the bonding pad 310 is one type of a probing damage caused by the probing needle 232. Another type of a probing damage is a crack 321 which might occur in the underlying layer(s) 320.

Both types of probing damage may be detrimental in wafer probing. If the indentation depth h exceeds a certain limit, the reliability of wire bonding on the bonding pad 310 is significantly reduced. A crack 321 occurring in the underlying layer 320 may cause a breakdown of the integrated device.

Further to the bonding pad 310 and the underlying layer 320, the wafer 240 may, e.g., include another metal layer 330 arranged beneath the underlying layer(s) 320 and another underlying layer (e.g. low-k layer) 340 arranged beneath the metal layer 330.

FIG. 4 is a cross-sectional view illustrating an exemplary indentation depth analyzer 400 and a process of measuring the indentation depths h of a plurality of bonding pads 310 on the wafer 240. The measurement may be performed after one touch-down experiment of wafer probing. A confocal microscope 410 may be used to measure the indentation depths h of each individual bonding pad 310. Hence, if a probe card of, e.g., 10000 probing needles 232 is used, a number of 10000 individual (e.g. different) indentation depths h may be recorded.

The indentation depth analyzer 400 as illustrated in FIG. 4 may be an integral part of the wafer test equipment 200. In this case, after the process of wafer probing (see FIGS. 2A-2B), the confocal microscope 410 is placed in a position to face down on the wafer 240 (while the holder 210 with the probe card 230 may, e.g., be removed).

Figures 5, 6:
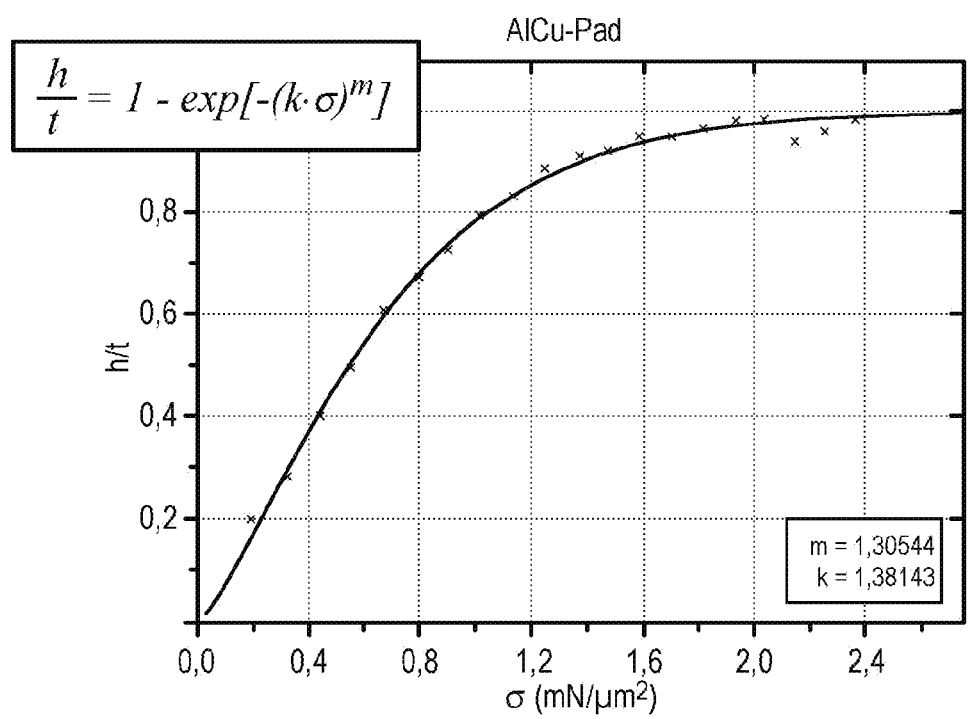
FIG. 5 is a diagram illustrating an example chart of measured individual indentation depths of a plurality of bonding pads on a wafer.
FIG. 6 is a diagram illustrating an example of determining a set of calibration coefficients from a chart of individual indentation depths by curve-fitting a function yielding a predicted indentation depth depending on stress to the measured chart data.

FIG. 5 illustrates an exemplary chart of individual indentation depths h (in µm) provided by the corresponding probing needles 232 of individual tip diameter D (in µm). As apparent, a high number of correlated data pairs (D, h) may be accumulated during one touch-down.

The chart of indentation depths h of the plurality of bonding pads caused by contact procedures at different stress may be obtained via different experimental procedures. A variation of stress can either be achieved by a variation of the force exerted by the tip or by a variation of the tip diameter or by both. Hence, a first possibility of obtaining a chart of indentation depths is to vary the force applied by a probing needle onto the bonding pads at known tip diameter. By way of example, such experiments can be performed with one single probing needle which is pressed down onto a plurality of bonding pads by using different forces (e.g. by applying different overdrives d). Another possibility is to exploit the (inevitable) distribution of tip diameters of the probing needles of a probe card. In this case, the probe card is touched down on the wafer to a certain setting position and the forces applied by the individual probing needles may, e.g., be computed based on the probe card specification and the overdrive (common to all probing needles and thus representative of an identical force, or corrected by individual idle positions of the probing needles and thus representative of individual forces). The variation of stress among the probing needles is then "automatically" produced by the variation in tip diameter (or, more generally, tip geometry) of the individual probing needles. In other words, one touch-down procedure may provide for a high number of contact procedures at different stresses. That way, a complete chart of indentation depths as a function of stress (in terms of, e.g. tip diameter D) can be obtained by one touch-down procedure and the knowledge of each individual tip diameter D (see, e.g., the chart of FIG. 5). As mentioned previously, the tip diameter D may effectively express a geometry of the tip which is more complicated than an ideal circular outline circumventing a flat tip surface. In particular, a number of parameters of the geometry of the tip can be measured such as, e.g., the contact area, the contact area outline and the planarity of the contact area, and all these parameter measurement values may influence the effective (or nominal) diameter D of the tip.

The elastic and plastic material properties of a bonding pad material are dependent on the normalized indentation depth h/t. Thus, if the hardness of the bonding pad material changes during indentation, the plastic deformation will change analogously as a function of stress. Hence, variations of either the force or the contact area (i.e. the (nominal) tip diameter D) could be taken into account as a change of stress. This allows a prediction of the indentation depth h for any variations of F or D or F and D for an individual probing needle. As mentioned, probing needle-bonding pad contact experiments may either be performed by a repetition of single needle touch-downs on a pad-by-pad basis or by "parallel" contact procedures using a probe card and the natural distribution of contact areas/tip diameters of the probing needles, which have been measured and recorded for every probing needle tip before.

FIG. 6 is a diagram illustrating an example of determining calibration coefficients from the chart of correlated data pairs (D, h) of FIG. 5. The crosses indicate corresponding measurement data ($\sigma(D)$, h/t). Hence, here the calibration coefficients are determined based on the measured tip diameters D. A first function predicting the normalized indentation depth h/t based on the stress $\sigma(D)$ may include the relation $$h/t = 1 - \exp[-(k \times \sigma)m] \qquad (1)$$

wherein (k, m) is a subset or the set of calibration coefficients.

FIG. 6 further illustrates a curve of the predicted normalized indentation depth h/t as obtained by the relation (1) after curve fitting. Curve fitting means selecting coefficients (k, m) to obtain a best fit of the curve to the chart data of FIG. 5, which shows up in FIG. 6 by crosses. Curve fitting may be performed by any suitable approach, e.g. by a least mean square fit, etc.

FIG. 6 relates to bonding pads fabricated in a first wafer processing line. In this example the bonding pads are made of AlCu and have a thickness t of about 2.8 µm. As apparent from FIG. 6, the normalized predicted indentation depth h/t has a high degree of conformity with the experimental chart data. The calibration coefficients, as determined by curve fitting, are in this example m=1.30544 and k=1.38143.

Figure 7A:
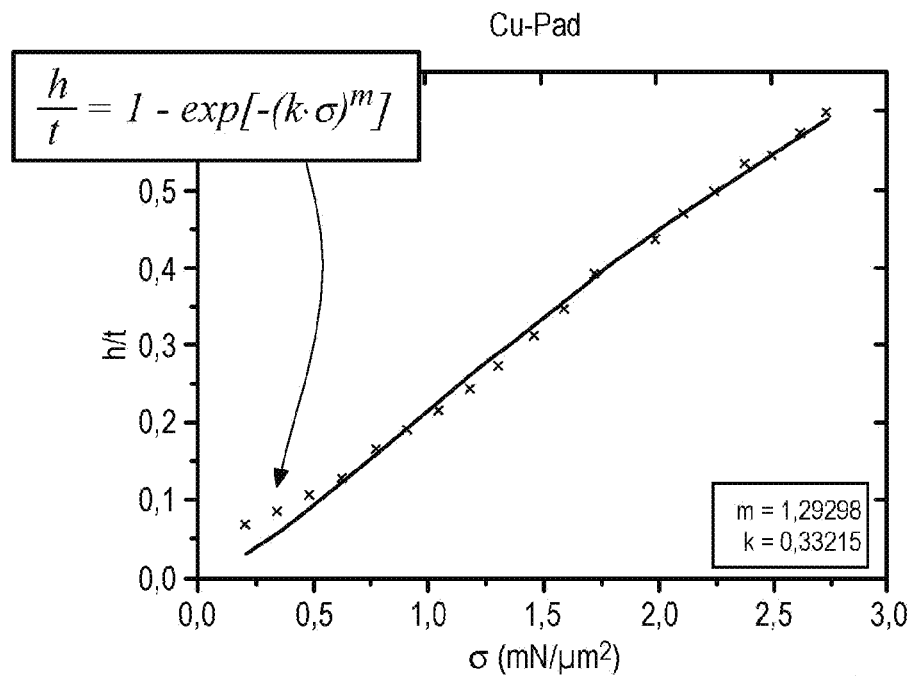
FIG. 7A is a diagram illustrating an example of determining a first set of calibration coefficients from a chart of individual indentation depths by curve-fitting a first function yielding a predicted indentation depth depending on stress to the measured chart data.

FIG. 7A illustrates an example of a second function yielding a predicted normalized indentation depth h/t depending on stress applied by a probing needle to a bonding pad fabricated in a second wafer processing line. Here, a Cu bonding pad is used and the thickness oft of the bonding pad is, as an example, 6 µm. From FIG. 7A it is apparent that the experimental chart data is strongly different from the experimental chart data depicted in FIG. 6. However, curve fitting a function containing the relation (1) to the measured chart data provides for a rather good prediction of the normalized indentation depth h/t based on the stress. The calibration coefficients derived by curve fitting are, e.g., m=1.29298, k=0.33215.

Therefore, with the determined set of calibration coefficients (m, k), it is now possible to predict the indentation depths h for any probe force F (or overdrives d) and/or (nominal) tip diameter D on a bonding pad fabricated in a specific wafer processing line (e.g., an AlCu bonding pad of wafer processing line of FIG. 6 or a Cu bonding pad of wafer processing line of FIG. 7A).

Referring to FIG. 7A, it appears that the normalized predicted indentation depth h/t deviates from the experimental chart data for small values of the stress $\sigma$. It has been found that this deviation may be caused by geometric uncertainties of the individual probing needle tips. For compensation of these geometric uncertainties an additional calibration coefficient b may be added into the relation (1) so as to read $$h/t = 1 - (1-b)\exp[-(k \times \sigma)^m] \qquad (2)$$

wherein (k, m, b) is the set or a subset of the set of calibration coefficients of the relation (2).

Figure 7B:
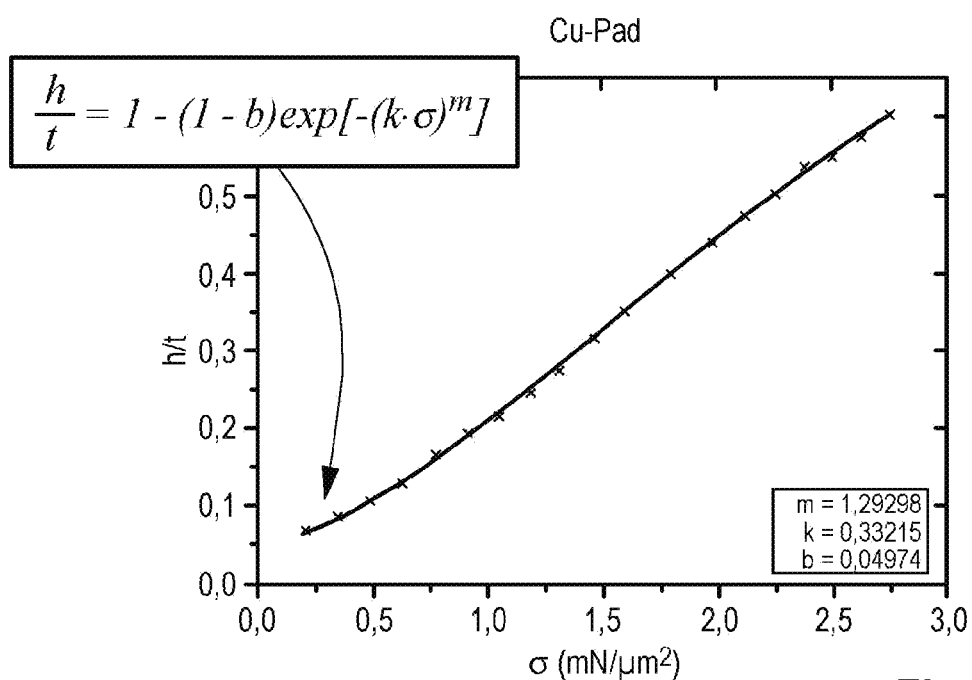
FIG. 7B is a diagram illustrating an example of determining a second set of calibration coefficients from a chart of individual indentation depths by curve-fitting a second function yielding a predicted indentation depth depending on stress to the same measured chart data as in FIG. 7A.

Curve fitting the relation (2) to the experimental chart data is illustrated in FIG. 7B. Apparently, the prediction of the normalized indentation depth h/t is optimized even for low contact forces. The calibration coefficients, as determined by curve fitting, are in this example m=1.53706, k=0.33154 and b=0.04974.

Furthermore, the standard error of the parameters (k, m, b) may be computed as a goodness-of-fit estimate. The standard errors are in this example <m>=0.03636, <k>=0.00223 and <b>=0.00549. The goodness-of-fit estimate gives information about the tip condition and can be used as an alarm trigger for any unusual behavior revealing, for example, an incorrectly implemented cleaning/shaping procedure. In other words, if a deviation between the experimental chart data (crosses) used for curve fitting and the obtained curve of predicted normalized indentation depths is equal to or greater than a certain threshold of, e.g., one or more of the standard errors, an alarm could be triggered.

The set of calibration coefficients can be derived, e.g., on a single needle experimental tool used for probing bonding pads of different wafer technologies (e.g. different materials and/or different thickness). In this case, the exemplary wafer test equipment as illustrated in FIGS. 2A-2B does not need to be used for deriving the set of calibration coefficients. However, in order to take every uncertainty into account, the set of calibration coefficients may be determined within the running system, i.e. within the wafer test equipment 200 of FIGS. 2A-2B by using the same probe card which is used during productive wafer probing. In this case, the calibration coefficients are derived by using the same probing needles as used during wafer testing. When using the wafer test equipment 200 of FIGS. 2A-2B for performing the contact procedures on the basis of which the set of calibration coefficients is derived, the wafer test equipment 200 may further include a computation unit configured to determine the set of calibration coefficients, wherein the set of calibration coefficients allows to compute the predicted indentation depth of a probing needle on a bonding pad as a function of stress applied by the probing needle to the bonding pad. The computation unit may further be configured to determine the minimum permissible tip diameter based on an evaluation of the function.

Figure 8:
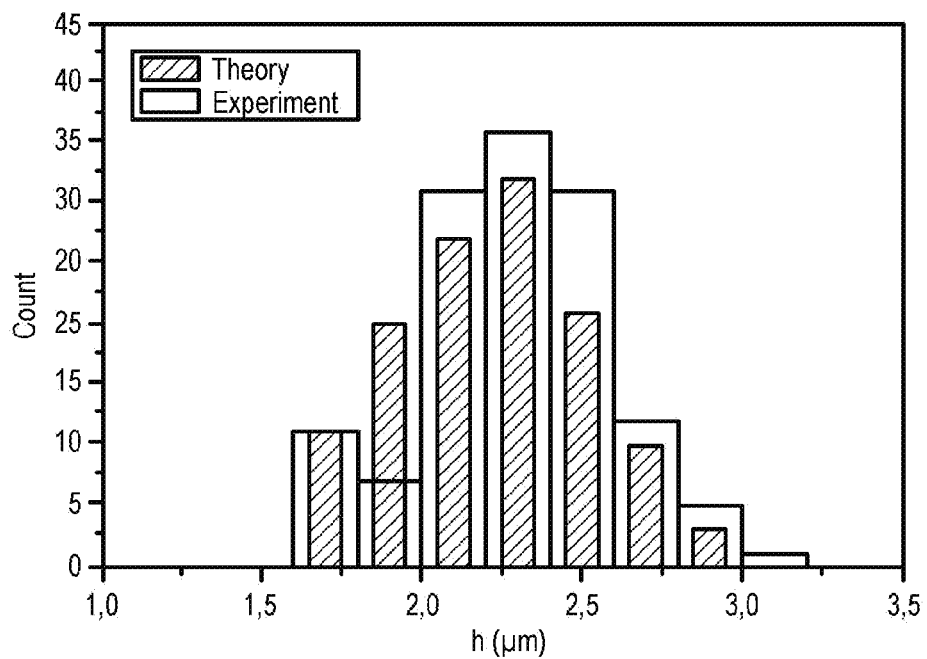
FIG. 8 is a diagram illustrating an example of an occurrences count of indentation depths as obtained by measuring the indentation depth ("experiment") and by calculating the predicted indentation depth as a function of (individual) stress applied by the individual probing needles to a bonding pad.

FIG. 8 is a histogram for comparing the theoretical and experimental results. More specifically, the occurrences count of indentation depths h as obtained by measuring the indentation depth ("experiment"), and the occurrences count of indentation depth h as obtained by calculating the predicted indentation depth as a function of stress applied by the individual probing needles to a bonding pad are illustrated. The predicted distribution ("theory") shows a good correlation with the measured data ("experiment"). The theoretical distribution was derived by a function according to relation (1) where the calibration coefficients had been determined on the basis of a single-needle experimental tool. However, if the calibration coefficients are derived on the basis of chart data obtained by a measurement within the running system, an even better correlation should be obtained.

Figure 9:
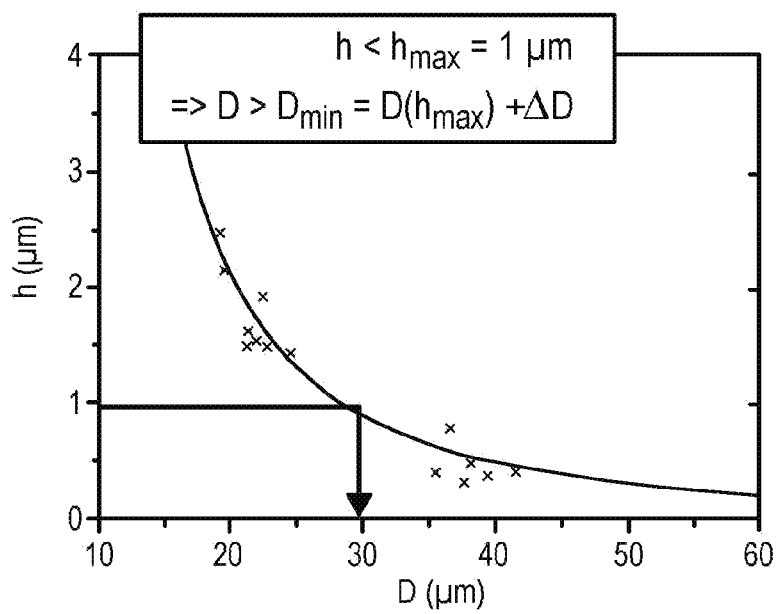
FIG. 9 is a diagram illustrating an example of determining a minimum permissible probing needle tip diameter based on evaluating a function given by the calibration coefficients.

FIG. 9 illustrates an example of determining a minimum permissible probing needle tip diameter based on evaluating a function derived by, e.g., curve fitting by the set of calibration coefficients. The function is evaluated at a predetermined maximum permissible (predicted) indentation depth $h_{max}$, e.g., at 1 µm. This yields a maximum permissible stress. The maximum permissible stress translates into a tip diameter $D(h_{max})$ for a certain touch-down force F (or a certain overdrive d) to be applied to the probe card during wafer probing. Taking a certain safety margin ΔD into account, the minimum permissible probe tip diameter $D_{min}$ may be given by $D_{min}=D(h_{max})+\Delta D$. The safety margin ΔD may, e.g., be derived based on the goodness-of-fit as indicated by one or more of the standard errors of the coefficients, see FIG. 8.

Figure 10:
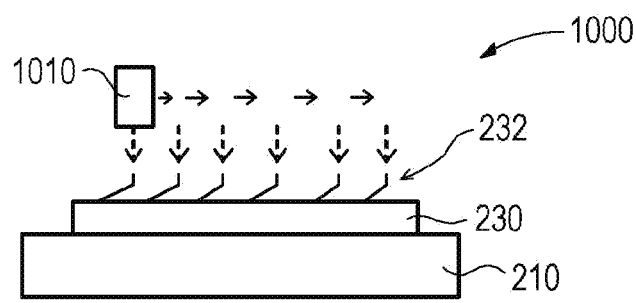
FIG. 10 is a cross-sectional view illustrating an example tip diameter measuring device, e.g. a probe card analyzer for measuring the tip diameters of the probing needles of a probe card.

FIG. 10 is a cross-sectional view illustrating a tip diameter measuring device 1000. The tip diameter measuring device 1000 may, e.g., be a probe card analyzer for measuring the tip diameters of the probing needles 232 of a probe card 230. The tip diameter measuring device 1000 may include, e.g., a microscope 1010 configured to measure a (nominal or effective) diameter D of each probing needle 232 of the probe card 230.

After having determined the minimum permissible probing needle tip diameter $D_{min}$ (see, e.g., FIG. 9) the tips of the individual probing needles 232 may be adjusted so as to comply with $D>D_{min}$. The diameters D of the tips may be reduced by, e.g., dipping the tips of the probing needles 232 into a solution which etches the tips. Contrary, the tip diameters D of the probing needles 232 may be increased by, e.g., mechanical abrasion.

In practice, during production, the probe card 230 is regularly inspected in a tip diameter measuring device 1000 as shown in FIG. 10. Then, the tip diameters are adjusted so that each tip diameter meets $D>D_{min}$. This adjustment of tip diameters may be performed during regular maintenance, e.g. several times a week or a month. It may be based solely on a comparison of the measured tip diameters D and $D_{min}$ as determined according to this disclosure. In particular, it is not necessary to perform a bonding pad indentation depth measurement and analysis at each time of maintenance.

Figure 11:
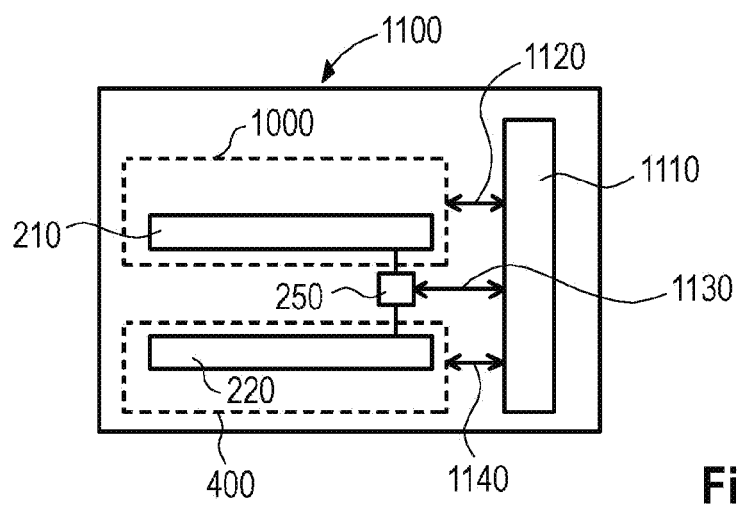
FIG. 11 illustrates a block diagram of an example wafer test equipment for wafer probing.

FIG. 11 illustrates a block diagram of a wafer test equipment 1100 in accordance with an example of the disclosure. The wafer test equipment 1100 may comprise a holder 210, a wafer support 220 and a manipulator 250 as described with reference to FIGS. 2A-2B. Further, the wafer test equipment 1100 may comprise a computation unit 1110. The computation unit 1110 may be configured to determine a set of calibration coefficients, wherein the set of calibration coefficients allows to compute a predicted indentation depth of a probing needle on a bonding pad as a function of stress applied by the probing needle to the bonding pad. By way of example, one of the sets of calibration coefficients (m, k) or (m, k, b) as described above may be determined by the computation unit 1110. Further, the computation unit 1110 may be configured to determine the minimum permissible probing needle tip diameter $D_{min}$ based on an evaluation of the function. The determination of $D_{min}$ may be performed by any of the methods described above.

The wafer test equipment 1100 may optionally be equipped with the tip diameter measuring device 1000 of FIG. 10. In this case, the wafer test equipment 1100 may analyze from time to time the tip diameters of the probe card in order to verify that the probe card is still in a good condition (all probing needle tip diameters D are equal to or greater than $D_{min}$) or, otherwise, to inform on the necessity of probe card maintenance or exchange. Data transfer between the computation unit 1110 and the tip diameter measuring device 1000 may be performed via data connection 1120.

Alternatively or additionally, the wafer test equipment 1100 may include an indentation depth analyzer 400. The indentation depth analyzer 400 is configured to determine a chart of individual indentation depths h on the bonding pads caused by the individual probing needles, see right column of FIG. 5. The data transfer between the indentation depth analyzer 400 and the computing unit 1110 may be performed via data connection 1140.

More specifically, the measured indentation depths h may be reported via data connection 1140 to the computation unit 1110. The computation unit 1110 may further receive overdrive data via a data connection 1130 between the manipulator 250 and the computation unit 1110. Overdrive data and probe card specifications (e.g. stiffness of the probing needles) together with the individual tip diameters D of the probe card needles (e.g. received via data connection 1120 or from an external tip diameter measuring device) allow to compute the stress applied by each individual probing needle. That way, a chart as, e.g., illustrated in FIG. 5 may be established and a set of calibration coefficients may be computed.

It is to be noted that one or both of the tip diameter measuring device (probe card analyzer) 1000 and the indentation depth analyzer 400 may be external devices. In this case, the data connections 1120 and/or 1140 correspond to respective interfaces to (optionally) connect to these external devices.

Figure 12:
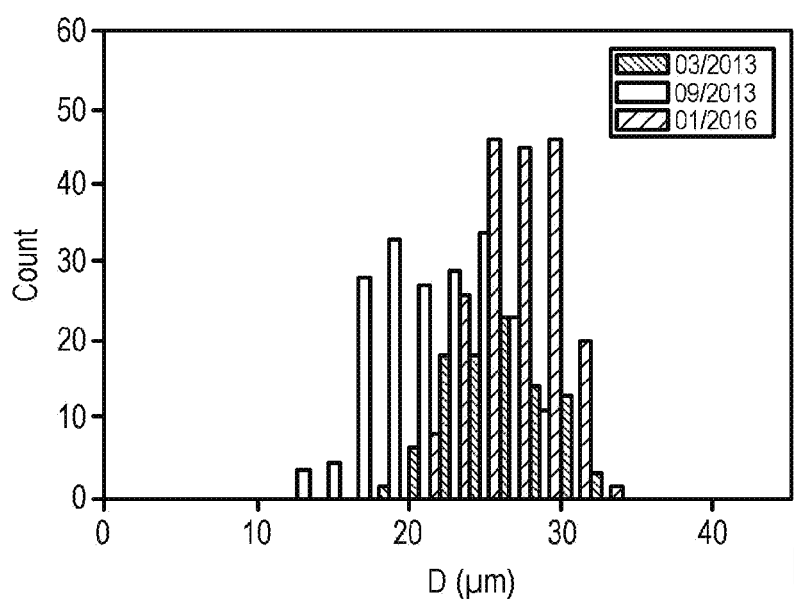
FIG. 12 is a diagram illustrating an example of three distributions of tip diameters determined for a probe card at different instances in time.

FIG. 12 is a diagram illustrating an example of three distributions of tip diameters measured for a probe card at different instances in time, i.e. at March 2013, September 2013 and January 2016. These distributions were derived by retrospectively analyzing probe card tip diameter measurements which had been taken during probe card maintenance at these times.

Figure 13:
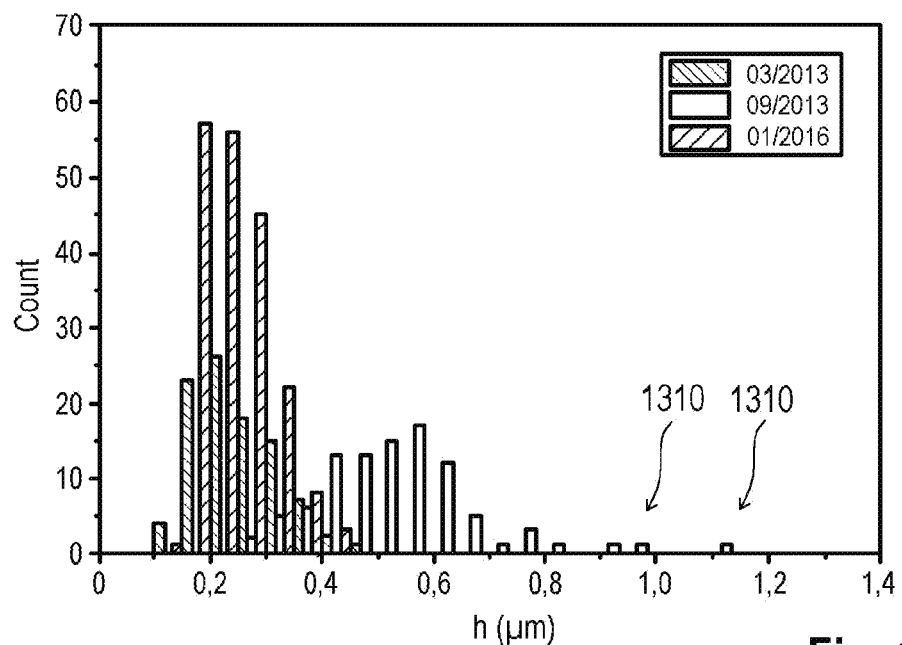
FIG. 13 is a diagram illustrating the (calculated) predicted indentation depths of the three distributions of tip diameters of FIG. 12.

In order to verify the approach of "indirect" process monitoring, expected indentation depth counts were calculated on the basis of the three distributions. The results of the (calculated) predicted indentation depths of the three distributions of tip diameters of FIG. 12 are illustrated in FIG. 13. The calculated results show that extremely deep imprints 1310 (exceeding the maximum admissible indentation depth limit of, e.g., 0.5 µm for safe bonding) were expected during September 2013. In fact, these (few) extremely deep imprints 1310 computed by "indirect" monitoring are likely to relate to a production failure during September 2013. In other words, by virtue of the analysis on tip diameter measurements as taught herein within the concept of "indirect" process monitoring, a production failure as experienced in reality in September 2013 were likely to be avoided.

Figure 14:
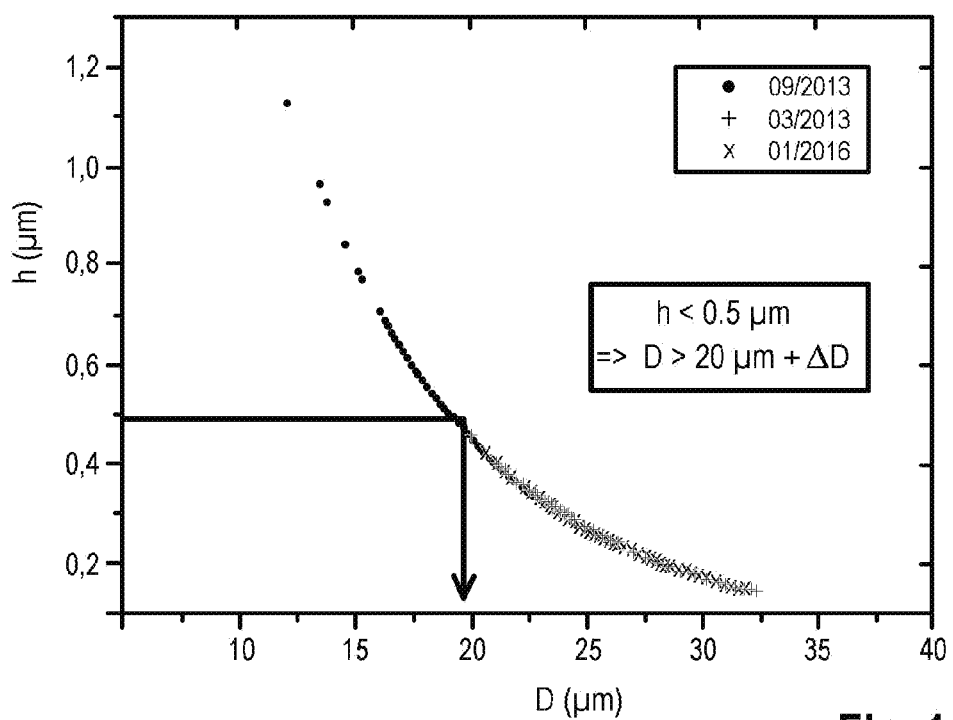
FIG. 14 is a diagram illustrating the (calculated) predicted indentation depths of the three distributions of tip diameters of FIG. 12 versus the (measured) probing needle tip diameters as measured over all three distributions of FIG. 12 and an example of determining a minimum permissible probing needle tip diameter based on evaluating a function given by calibration coefficients derived on the data illustrated by FIG. 13.

FIG. 14 illustrates a graph of the (calculated) predicted indentation depths h of the three distributions of tip diameters of FIG. 12 versus the (measured) probing needle tip diameters D as measured over all three distributions of FIG. 12. Requiring a maximum indentation depth of $h_{max}=0.5$ µm leads to a maximum permissible probing needle tip diameter $D>20$ µm+$\Delta D$, where $\Delta D$ may be related to the goodness-of-fit. In FIG. 14 all predicted indentation depths h are calculated on the basis of the same set of coefficients valid for the (single) wafer technology used during production at March 2013, September 2013 and January 2016.

Further, a computer program for determining a minimum permissible probing needle tip diameter of probing needles of a probe card for wafer probing which, when running on a computer or loaded in a computer, carries out or is capable of carrying out one of the exemplary methods described herein, is disclosed. The method may comprise recording a chart of indentation depths on bonding pads caused by a plurality of contact procedures of at least one probing needle to a plurality of bonding pads on the wafer, wherein the contact procedures are performed at different stress applied by the at least one probing needle to the bonding pads; determining a set of calibration coefficients based on the chart; computing based on the set of calibration coefficients a predicted indentation depth as a function of the stress; and determining the minimum permissible probing needle tip diameter based on an evaluation of the function.

Such computer program may, e.g., be loaded in the computation unit 1110 of the wafer test equipment 1100. In particular, it may be loaded by way of a firmware update into the wafer test equipment 1100. However, it is also possible to run the computer program on any other device such as, e.g., a probe card analyzer 1000 and/or a wafer indentation depth analyzer 400 and/or on a stand-alone CPU (central processing unit) such as, e.g., a PC (personal computer) or server which may be adapted to be connected to other devices via interface.

Figure 15:
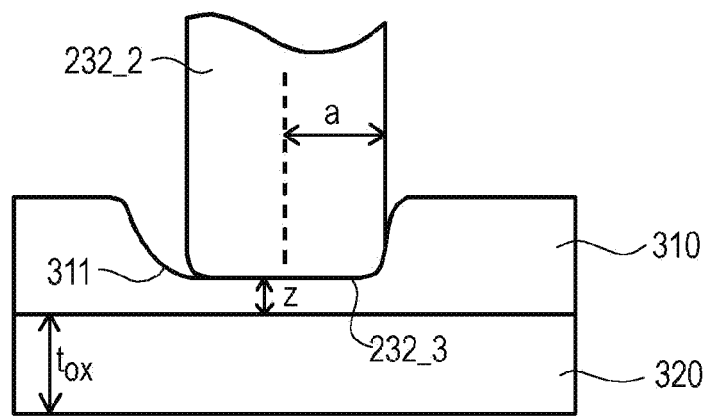
FIG. 15 is a cross-sectional view illustrating a plastic deformation of a bonding pad caused by a probing needle tip and the stress exerted on an underlying layer underlying the bonding pad.

As mentioned previously, a second type of probing damage is the occurrence of a crack in an underlying layer underlying the bonding pad. FIG. 15 illustrates a cross-sectional view of a plastic deformation (indentation 311) of a bonding pad 310 caused by a probing needle tip 232_3. A radius a of the probing needle tip 232_3 is denoted by a, with a=D/2. The residual thickness of the bonding pad 310 is denoted z. The stress $\sigma_{ox}(z)$ reaching the underlying underlying layer 320 may be written as $$\sigma_{ox}(z) = \sigma_{max}\left(1 + \left(\frac{z}{a}\right)^2\right)^{-1}, \quad (3)$$

wherein $\sigma_{max}$ denotes the maximum stress which could reach the underlying layer 320. This maximum stress $\sigma_{max}$ corresponds to the stress $\sigma(z=0)$, i.e. the stress σ which acts on the bonding pad 310.

Figure 16:
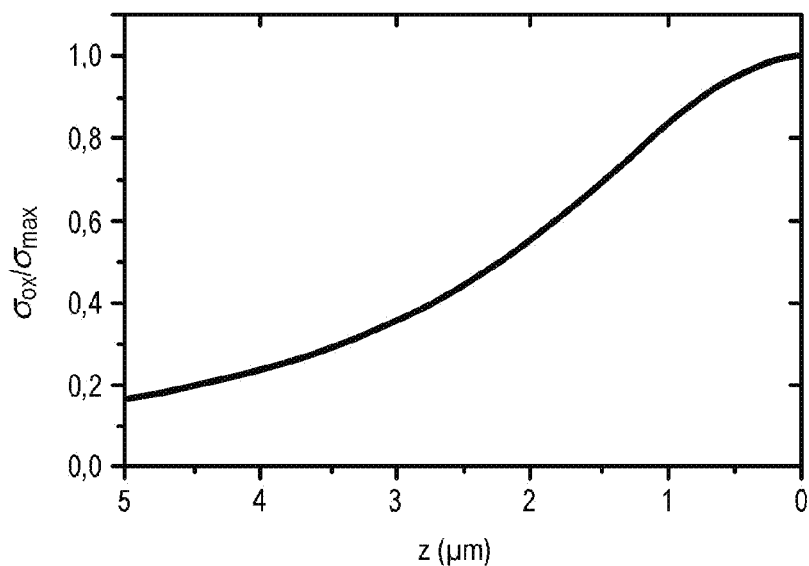
FIG. 16 is a diagram illustrating the calculated stress acting on the underlying layer normalized by stress applied to the bonding pad as a function of the residual bonding pad thickness z.

FIG. 16 illustrates the calculated normalized stress $\sigma_{ox}(z)/\sigma_{max}$ acting on the inorganic layer 320 as a function of the residual bonding pad thickness z.

The stress $\sigma_{ox}(z)$ acting on the inorganic layer 320 is inserted in a crack probability distribution of the underlying layer 320. By way of example, the crack probability distribution may be based on the Weibull distribution $$P(\sigma) = 1 - \exp\left[-\left(\frac{\sigma_{ox}}{\sigma_0}\right)^{m_w}\right] \quad (4)$$

where $m_w$ denotes the Weibull modulus and $\sigma_0$ denotes the characteristic strength (of the underlying layer 320).

Instead of the Weibull distribution and its specific set of parameters (Weibull modulus $m_w$ and characteristic strength $\sigma_0$), other given probability distributions having other specific parameters could, e.g., be used to express the crack probability. Thus, the Weibull distribution should be taken only as one example in accordance with various embodiments to express crack probabilities based on material parameters.

Generally, determining a set of parameters of a given probability distribution according to the disclosure above allows to estimate the failure risk (i.e. crack probability) of the underlying layer 320 separated from the influence of probing needle and bonding pad properties. This allows to estimate a failure risk (crack probability) only on the basis of the determined set of parameters as a function of stress applied to the bonding pad (e.g. as a function of tip diameter D in accordance with known σ(D) or as a function of overdrive d in accordance with known σ(d)). The parameters may, e.g., only be indicative of material properties of the underlying layer 320.

Figure 17:
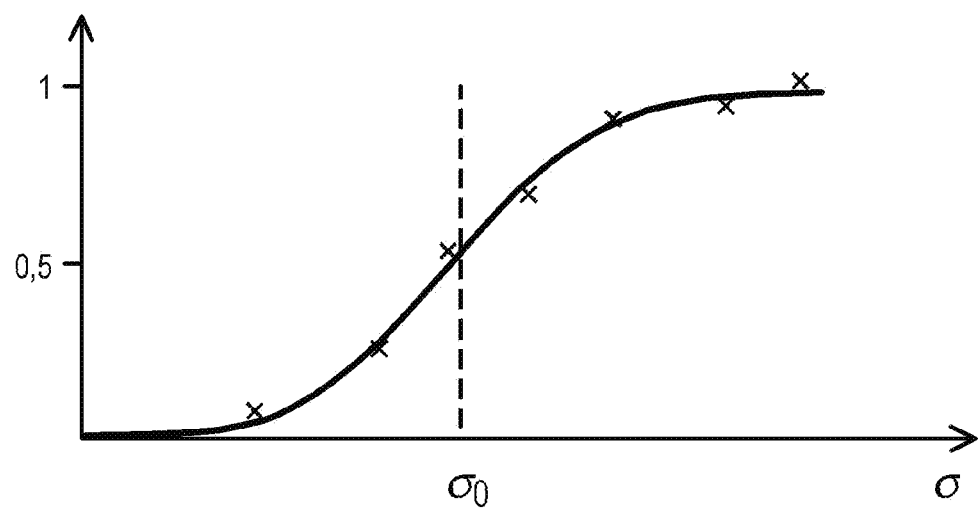
FIG. 17 is a diagram illustrating experimental data on crack probability and the (calculated) crack probability according to the Weibull probability distribution when fitted to the experimental crack probability data.

FIG. 17 is a diagram illustrating the (calculated) crack probability P according to the Weibull probability distribution when fitted to predetermined data (indicated by crosses) on crack probability. Curve fitting may be performed by any suitable approach, e.g., by a least mean square fit to obtain the parameters ($m_w$, $\sigma_0$) of the Weibull probability distribution.

Figure 18:
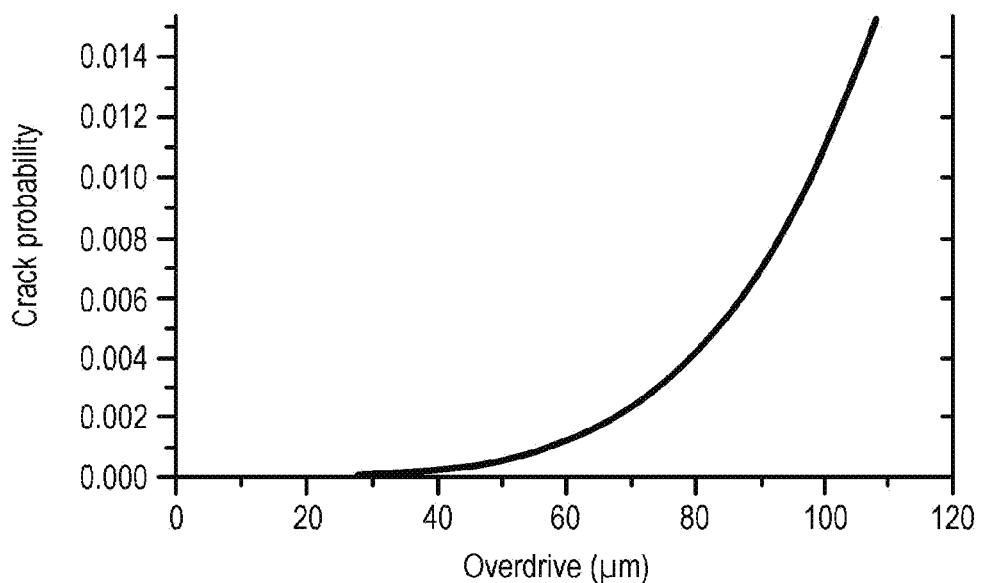
FIG. 18 is a diagram illustrating the calculated crack probability as a function of probing needle overdrive d during wafer probing.

Based on determined probability parameters ($m_w$, $\sigma_0$), the crack probability as a function of probing needle overdrive d during wafer probing can be calculated. FIG. 18 illustrates a diagram of the calculated crack probability P(d) based on previously determined parameters ($m_w$, $\sigma_0$).

Figure 19:
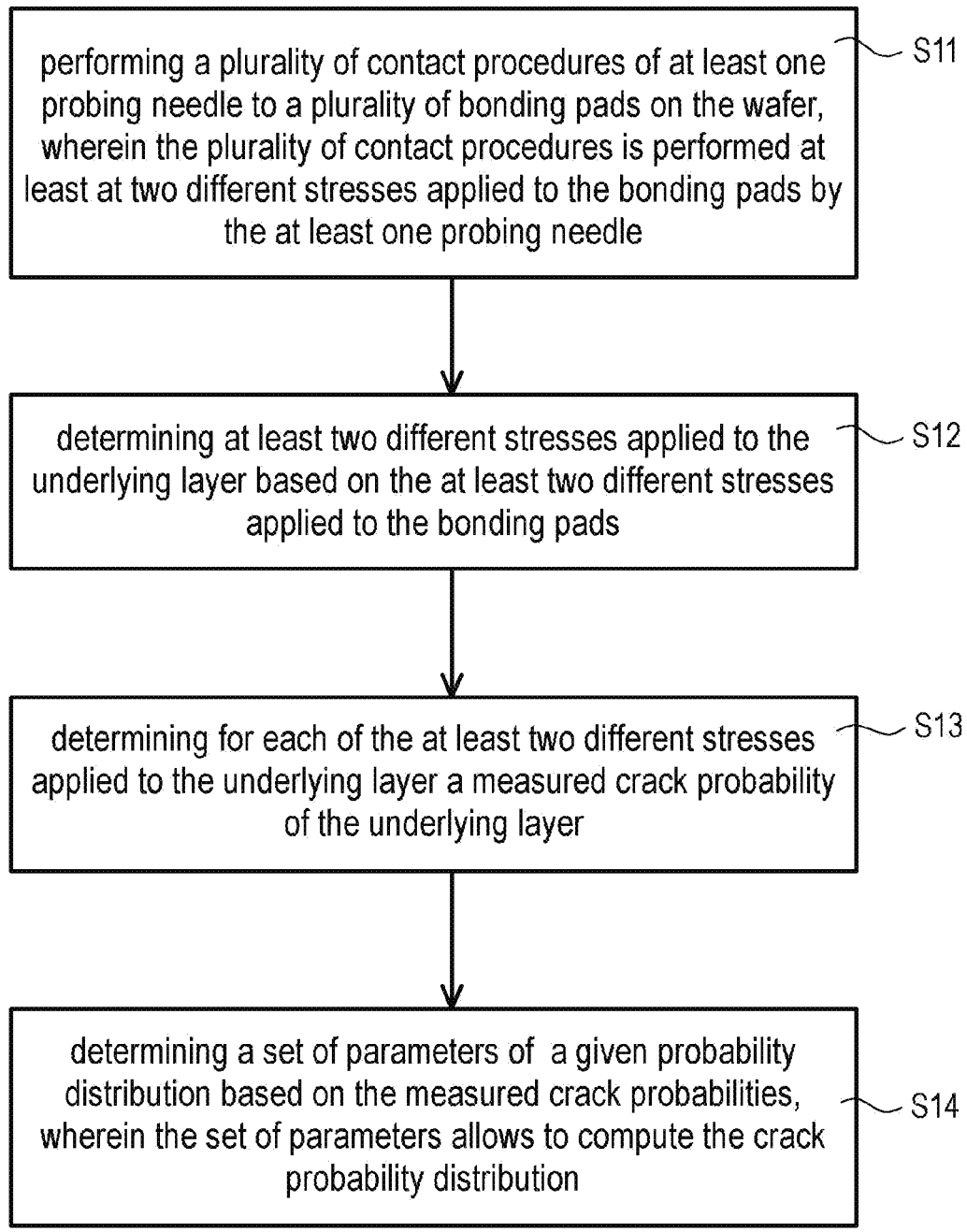
FIG. 19 is a flow-chart of an example method of determining a crack probability distribution of an underlying layer arranged beneath a plurality of bonding pads on a wafer.

FIG. 19 is a flow chart of an exemplary method of determining a crack probability distribution of an underlying layer arranged beneath a plurality of bonding pads on a wafer. At S11 a plurality of contact procedures of at least one probing needle to a plurality of bonding pads on the wafer is performed. The plurality of contact procedures is performed at least at two different stresses applied to the bonding pads by the at least one probing needle. Again, as has been described before in conjunction with the contact procedures used to determine a chart of indentation depths, the contact procedures may either be applied sequentially by a single probing needle tool or simultaneously by a touch-down of a probe card taking into account the distribution of probing needle tip diameters.

At S12 at least two different stresses applied to the underlying layer are determined based on the at least two different stresses applied to the bonding pads. This may, e.g., be performed by using the equation (3).

At S13, for each of the at least two different stresses applied to the underlying layer, a measured crack probability of the underlying layer is determined. S13 may be performed by a variety of different processes, and examples thereof will be described further below.

At S14 a set of parameters of a given probability distribution based on the measured crack probabilities is determined, wherein the set of parameters allows to compute the crack probability distribution. The set of parameters may be indicative of the robustness of the underlying layer. As mentioned above, by way of example, a given probability distribution could be the Weibull distribution of equation (4) with parameters ($m_w$, $\sigma_0$).

Referring to the variety of different processes mentioned at S13, a first possibility (option A) of obtaining measured crack probabilities at different stresses applied to the underlying layer uses counting the number of cracks after performing probing experiments. As the "exact" determination of crack probabilities is typically in the parts-per-million regime, a high number of contact procedures are needed and the diameter D of every probing needle may be taken into account. As described above, the diameter D may be a "nominal" or "effective" diameter taking into account non-ideal tip geometry such as, e.g., non-ideal tip planarity or non-circular tip outline.

Then, summation of all crack occurrences relative to the number of experiments will lead to varying crack numbers as a function of stress thereby revealing the relevant Weibull parameters ($m_w$, $\sigma_0$) for underlying layer robustness.

A second possibility of obtaining measured crack probabilities (option B) is based on counting a number of crackless needle contact procedures for at least two different tip diameters of at least two probing needles. This approach may also be denoted as underlying layer robustness qualification via statistical safety margin. Having performed, for example, 10000 contact procedures without finding a single crack, a worst case characteristic strength $\sigma_0$ can be assumed via summation of all probabilities, defining them as equal to 1/10000.

The Weibull modulus $m_w$ can be expected to be in a similar regime for underlying layers such as, e.g., brittle oxide layers. However, a worst case fit could be performed as well using a second run of contact procedures with another tip diameter D (or, if using a probe card, with another tip diameter distribution) without finding cracks.

Figure 20:
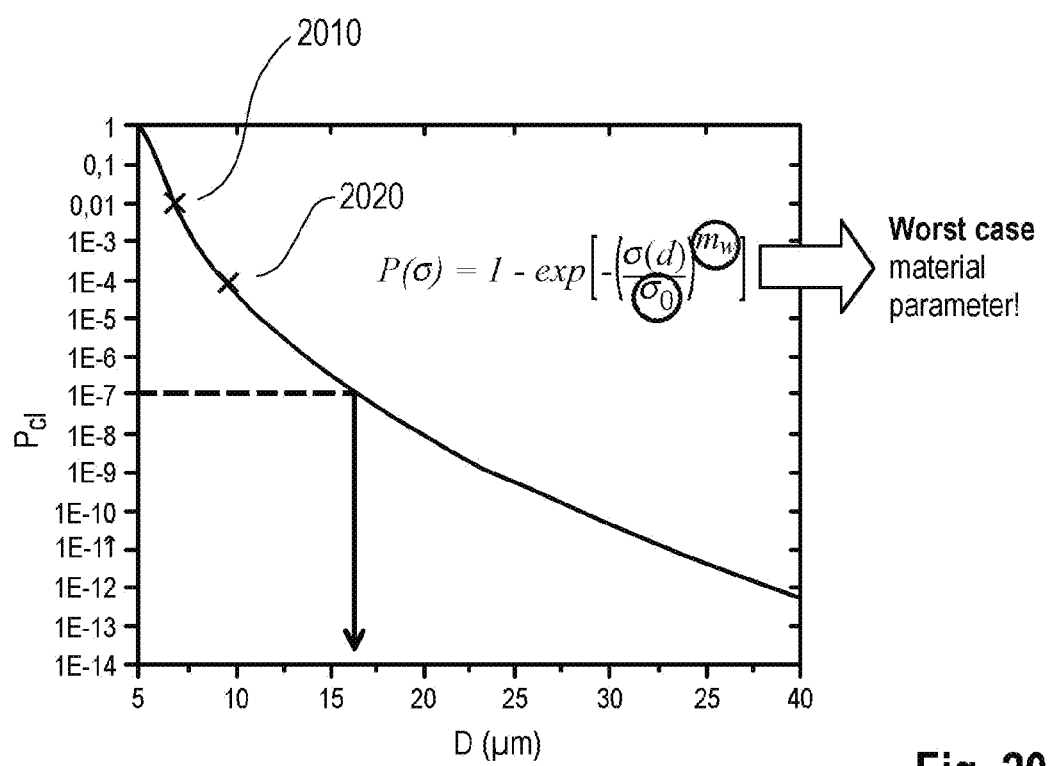
FIG. 20 is a diagram illustrating experimental data on crack probability and the (calculated) crack probability according to the Weibull probability distribution when fitted to the experimental crack probability data.

A basic principle of the robustness qualification via statistical safety margin is illustrated in FIG. 20. FIG. 20 illustrates a graph with the (measured) tip diameter D depicted on the x-access and the probability of finding no cracks $P_{cl}$ depicted on the y-access. The probability $P_{cl}$ of finding no cracks (cl means "crackless") is determined by experiment as described above. The crack probability (or better to say an upper limit thereof) is then defined by $P_{cl}$.

As an example, first experimental data 2010 is obtained by an experiment with, e.g., 100 contact procedures of a single probing needle having a tip diameter D of 7 μm. As no cracks are found, the measured zero-defect probability $P_{cl}$ is 1/100, and hence, the crack probability is estimated to be less than 1/100. Second experimental data 2020 is, e.g., obtained by an experiment of 10000 contact procedures with a single probing needle having a tip diameter D of 10 μm. Again, as no cracks are found, the measured zero-defect probability $P_{cl}$ is 1/10000, and the crack probability is then estimated to be less than 1/10000.

In principle, these two experimental data 2010, 2020 are sufficient to determine a set of parameters of the probability distribution (e.g. the parameters ($m_w$, $\sigma_0$) of the Weibull distribution) by curve fitting. These parameters may be interpreted as worst case material parameters, as they are derived on experimental zero-defect data indicating "no cracks found", which could be interpreted as an upper limit for the occurrence of a single crack.

After the set of parameters of the Weibull distribution is determined based on the measurement of "no cracks found" (see S14), a minimum permissible probing needle tip diameter D may be determined for a specific required zero-defect probability $P_{cl}$. By way of example, if a zero-defect probability $P_{cl}$ of 0.1 ppm (i.e. $10^{-7}$) is required, an evaluation of the crack probability distribution as calculated on the basis of the (measured) zero-crack crack probabilities yields a minimum permissible tip diameter of 16 μm.

It is to be noted that much more than only two experimental data 2010, 2020 may be used for determining the set of probability parameters based on measurement. Further, the experimental data 2010, 2020 may be obtained by performing at least one touch-down of a probe card on a wafer, whereby the at least two different stresses (or probing needle tip diameters) are "automatically" made available by the distribution of probing needle tip diameters on a probe card. The actual probing needle tip diameters of the probe card (as, e.g., measured in a probe card analyzer) can then be checked as to whether or not they are equal to or greater than the minimum permissible tip diameter, i.e. comply with the required level of the zero-defect probability $P_{cl}$.

A third possibility of determining a measured crack probability (option C) of the underlying layer is based on the technique of nanoindentation. It is a well-established that material parameters can be determined with high accuracy by the technique of nanoindentation. Having determined the robustness of the underlying layer 320 via the technique of nanoindentation, such material parameters would be applicable to all technologies using the same insulation material.

Experimental investigations showed that bonding pad design changes (i.e. different bonding pad layouts such as, e.g., lines, slots and 2-dimensional slot (square pattern)) affect the insulation crack probability in the range of only several percent.

Hence, for several wafer technologies, the influence of the bonding pad design could be completely neglected, making the high effort of probing damage wafer inspection unnecessary in case of a bonding pad design change.

However, with the new methods described herein it was shown that force and tip diameter affect the crack probability orders of magnitudes. As the tip diameter D has such a high impact on crack probability, it is clear why this dependence has not been observed before. In wafer probing experiments performed with classical approaches the variation of the tip diameter is only a few microns. Then, a statistical effort of several billions of experiments would be needed to observe cracks of low probability.

A fourth method of obtaining a measured crack probability (option D) of the underlying layer uses robustness qualification from productive experience. During production such billions of probing "experiments" (i.e. contact procedures) are performed every year. From probe card maintenance data, the reliability of a specific underlying layer can be estimated taking every probing needle into account.

The implementation of the method of determining a crack probability distribution of an underlying layer arranged beneath a plurality of bonding pads may be performed by the same devices as previously described in conjunction with the method of determining the minimum permissible probing needle tip diameter $D_{min}$ according to indentation depth bonding pad damages. More specifically, the method of determining a crack probability distribution of an underlying layer may be performed in the wafer test equipment 1100 of FIG. 11. In this case, the computation unit 1110 may be configured to determine for each of the at least two different stresses applied to the underlying layer a measured crack probability of the underlying layer (see S13). All processes described above for performing S13 may be supported by the computation unit 1100. Further, the computation unit 1110 may be configured to determine a set of parameters of a given probability distribution based on the measured crack probabilities (see S14).

Further, the computation unit 1110 may be configured to determine the minimum permissible probing needle tip diameter $D_{min}$ based on an evaluation of the crack probability distribution computed based on the determined set of parameters, see, e.g., the approach illustrated in FIG. 20.

Analogously as described for $D_{min}$ determined according to indentation depth bonding pad damage analysis, wafer test equipment 1100 may optionally analyze from time to time the tip diameters of the probe card in order to verify that the probe card is still in a good condition (all probing needle tip diameters D are equal to or greater than $D_{min}$ as determined according to underlying layer crack analysis) or, otherwise, to inform on the necessity of probe card maintenance or exchange. Thus, via tip monitoring during productive "tests", it can be assured that no probing needle tip diameter exceeds the required zero-defect limit. Since multiple probing needles contact one integrated device (e.g. die), a group of probing needles (i.e. the probing needles associated with one integrated device) should not exceed the required crack probability limit. Hence, tip diameter monitoring can serve as a process of monitoring crack probabilities (i.e. layer crack damages) to be expected to be below a certain limit and/or monitoring indentation depths to be expected to be below the maximum permissible indentation depth (i.e. pad imprint damages).

Further, a computer program for determining a crack probability distribution of an underlying layer arranged beneath a plurality of bonding pads on a wafer when subjected to a plurality of contact procedures of at least one probing needle to the plurality of bonding pads, wherein the plurality of contact procedures is performed at least at two different stresses applied to the bonding pads by the at least one probing needle, is disclosed. The computer program, when running on a computer or loaded in a computer carries out or is capable of carrying out a method comprising: determining at least two different stresses applied to the underlying layer based on at least two different stresses applied to the bonding pads; determining a set of parameters of a given probability distribution based on measured crack probabilities for the at least two different stresses applied to the underlying layer; and computing the crack probability distribution based on the determined set of parameters.

The method the computer program carries out or is capable of carrying out may further comprise determining a minimum permissible probing needle tip diameter based on an evaluation of the crack probability distribution at a maximum permissible crack probability.

Analogously or additionally to the computer program for determining a minimum permissible probing needle tip diameter based on (predicted) indentation depth computation, a computer program for determining a minimum permissible probing needle tip diameter based on an evaluation of the crack probability distribution may, e.g., be loaded in the computation unit 1110 of the wafer test equipment 1100. In particular, it may be loaded by way of a firmware update into the wafer test equipment 1100. However, it is also possible to run the computer program on any other device such as, e.g., a probe card analyzer 1000 and/or a wafer indentation depth analyzer 400 and/or on a stand-alone CPU (central processing unit) such as, e.g., a PC (personal computer) or server which may, e.g., be adapted to be connected to other of the above-mentioned devices via interface.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of determining a minimum permissible tip diameter of probing needles of a probe card for wafer probing, the method comprising:

performing a plurality of contact procedures of at least one probing needle to a plurality of bonding pads on a wafer, wherein the plurality of contact procedures is performed at different stress applied by the at least one probing needle to the bonding pads;

determining a chart of indentation depths of the plurality of bonding pads caused by the contact procedures at different stress;

determining a set of calibration coefficients based on the chart, wherein the set of calibration coefficients allows to compute a predicted indentation depth as a function of the stress; and determining the minimum permissible probing needle tip diameter based on an evaluation of the function.

2. The method of claim 1, wherein performing a plurality of contact procedures comprises:
performing at least one touch-down of a probe card on a wafer, wherein the probe card comprises a plurality of probing needles contacting the plurality of bonding pads on the wafer.

3. The method of claim 2, further comprising:
measuring the tip diameters of the plurality of probing needles of the probe card; and
determining the set of calibration coefficients based on the measured tip diameters.

4. The method of claim 1, wherein determining the minimum permissible probing needle tip diameter comprises:
evaluating the function at a predetermined maximum permissible predicted indentation depth to yield a maximum permissible stress; and
determining the minimum permissible probe tip diameter based on the maximum permissible stress and one of a touch-down force and a touch-down overdrive to be applied to the probe card during wafer probing.

5. The method of claim 1, wherein the function comprises the relation $h/t=1-\exp[-(k \times \sigma)^m]$, wherein h is the predicted indentation depth, t is a bond pad thickness, $\sigma$ is the stress, and (k, m) is a subset or the set of calibration coefficients.

6. The method of claim 1, wherein the function comprises the relation $h/t=1-(1-b)\exp[-(k \times \sigma)^m]$, wherein h is the predicted indentation depth, t is a bond pad thickness, $\sigma$ is the stress, and (k, m, b) is a subset or the set of calibration coefficients.

7. A method of adjusting tip diameters of probing needles of a probe card for wafer probing, the method comprising:
determining a minimum permissible probing needle tip diameter of the probing needles according to claim 1;
measuring the tip diameters of the plurality of probing needles of the probe card; and
adjusting the probing needle tip diameters so as to be equal to or greater than the minimum permissible probing needle tip diameter.

8. The method of claim 7, wherein measuring the tip diameters of each of the plurality of probing needles is done by optical inspection.

9. A wafer test equipment, comprising:
a wafer support configured to place a wafer thereon;
a probe card holder configured to hold a probe card;
a manipulator configured vary the distance between the wafer support and the probe card holder, the probe card comprising a plurality of probing needles for contacting bonding pads on the wafer; and
a computation unit configured
to determine a set of calibration coefficients, wherein the set of calibration coefficients allows to compute a predicted indentation depth of a probing needle on a bonding pad as a function of stress applied by the probing needle to the bonding pad, and
to determine the minimum permissible probing needle tip diameter based on an evaluation of the function.

10. The wafer test equipment of claim 9, further comprising:
an indentation depth analyzer configured to determine a chart of individual indentation depths on the bonding pads caused by the individual probing needles.

11. The wafer test equipment of claim 9, further comprising:
a tip diameter measuring device configured to measure the tip diameters of the plurality of probing needles of the probe card.

12. A computer program for determining a minimum permissible probing needle tip diameter of probing needles of a probe card for wafer probing, which, when running on a computer or loaded in a computer carries out or is capable of carrying out a method comprising:
recording a chart of indentation depths on bonding pads caused by a plurality of contact procedures of at least one probing needle to a plurality of bonding pads on the wafer, wherein the contact procedures are performed at different stress applied by the at least one probing needle to the bonding pads; determining a set of calibration coefficients based on the chart;
computing based on the set of calibration coefficients a predicted indentation depth as a function of the stress; and
determining the minimum permissible probing needle tip diameter based on an evaluation of the function.

13. The computer program of claim 12, wherein the function comprises the relation $h/t=1-\exp[-(k \times \sigma)^m]$ or the relation $h/t=1-(1-b)\exp[-(k \times \sigma)^m]$, wherein h is the predicted indentation depth, t is a bond pad thickness, $\sigma$ is the stress,
(k, m) is a subset or the set of calibration coefficients and (k, m, b) is a subset or the set of calibration coefficients.

* * * * *